United States Patent [19]

Uchiyama et al.

[11] Patent Number: 5,074,956
[45] Date of Patent: Dec. 24, 1991

[54] PATTERN FORMING METHOD

[75] Inventors: Akira Uchiyama; Toshiyuki Iwabuchi, both of Tokyo, Japan

[73] Assignee: Oki Electric Industry Co., Ltd., Tokyo, Japan

[21] Appl. No.: 571,536

[22] PCT Filed: Dec. 15, 1989

[86] PCT No.: PCT/JP89/01260
 § 371 Date: Aug. 27, 1990
 § 102(e) Date: Aug. 27, 1990

[87] PCT Pub. No.: WO90/07790
 PCT Pub. Date: Jul. 12, 1990

[30] Foreign Application Priority Data

Dec. 28, 1988 [JP] Japan ................................ 331809

[51] Int. Cl.⁵ ...................... H01L 21/306; B44C 1/22; C03C 15/00; C23F 1/02
[52] U.S. Cl. .................................. 156/643; 156/651; 156/656; 156/657; 156/659.1; 156/662; 437/41; 437/233; 437/245
[58] Field of Search ............... 156/643, 646, 647, 651, 156/652, 656, 657, 659.1, 662; 204/192.32, 192.35, 192.37; 427/38, 39; 437/40, 41, 228, 233, 245

[56] References Cited

FOREIGN PATENT DOCUMENTS 59-126661 7/1984 Japan .
62-97331 5/1987 Japan .
63-99534 4/1988 Japan .

OTHER PUBLICATIONS

"Practicing the Novolac deep-UV portable conformable masking technique", B. L. Lin, E. Bassous, V. W. Chao, & K. E. Petrillo, J. Vac. Sci. Technol., 19(4), Nov./Dec. 1981, pp. 1313-1319.
VLSI Technology, 7.6.2 Multilevel Resists, pp. 294-296.

*Primary Examiner*—William A. Powell
*Attorney, Agent, or Firm*—Wenderoth, Lind & Ponack

[57] ABSTRACT

The pattern forming method according to the present invention forms a film pattern on a side wall of a step in a base, such as a semiconductor substrate. The film of material used to form the film pattern is applied over the entire surface of the base including the step. The film is initially removed by anisotropic etching except at a side wall or walls of the step. The mask layer is then formed to extend over the portion of the film remaining on the side wall such that the mask extends from an upper portion to a lower portion of the step. Portions of the film remaining on the side wall are then selectively removed while using the mask layer as a mask such that a film pattern remains on the side wall.

2 Claims, 14 Drawing Sheets

PATTERN FORMING METHOD

BACKGROUND OF THE INVENTION

1. Field of the Invention

This invention relates to a method for forming a pattern of a film made of a desired material on a side wall of a stepped base, which pattern formation method is appropriately used, for example, for forming a desired film pattern of good precision on a plane which extends orthogonally to the main plane of the base in order to achieve high integration of an LSI.

2. Description of the Related Art

In order to improve the degree of integration of an LSI over a limited substrate area, the reduction of areas over which individual semiconductor elements constituting the LSI are defined on the main plane of the substrate has become more and more necessary. To this end, a technique has been employed wherein a groove is made in the substrate so that the side walls (portions corresponding to wall surfaces) are utilized as regions for forming semiconductor elements in order to provide an increased surface area over which the elements can be formed. However, the side walls defining such grooves have only been used, for example, to accommodate capacitor elements and have never been used to form a wiring pattern or a gate electrode of a transistor. Nevertheless, the necessity for forming a wiring pattern or elements on the side wall will be more and more in demand, and so it is believed to be necessary to establish a method wherein a wiring pattern or a gate electrode can be readily formed.

FIG. 5 illustrates a thin film pattern on a side wall, and is a perspective view of an ideal form of a thin film pattern. In this case, a semiconductor substrate 13 has a groove 11 with a depth l, and the thin film pattern 17 extends on a side wall 15 defining the groove 11 along the depth l of the groove 11.

However, it is very difficult to form such an ideal thin film pattern 17 as shown in FIG. 5.

FIGS. 6(A)–(C) illustrate main steps used to form a film pattern on a side wall according to a pattern forming method using the known single layer resist process. More particularly, FIGS. 6(A) and (C) are, respectively, partial perspective views taken in the direction P shown in FIG. 5, and FIG. 6(B) is a plan view of the sample shown in FIG. 6(A).

When the single resist process is used, a film 21 of material used to form a thin film pattern is formed on the surface of the semiconductor substrate 13 including over the inner surfaces thereof defining the groove 11. Next, the film material 21 is coated over the entire surface thereof, for example, with a positive resist (not shown). Subsequently, a light-shielding mask is provided at such a position that it crosses a boundary 11a of the step established by the groove 11, the resist is exposed to light irradiated from above the light-shielding mask, and the resist is developed to form a resist pattern 25 on a region traversing the boundary 11a of the step (FIG. 6(A)). However, the thus formed resist pattern 25 has a shape which is completely different from the shape of the light-shielding mask 23 as is particularly shown in FIG. 6(B). The reason for this is that the resist which has been applied over the surface of the semiconductor substrate 13 is thicker at the bottom portion of the groove and particularly at the corner portions of the groove 11, so that the exposure light does not reach the lower side of the thicker portion of the resist. Accordingly, a thin film pattern 21a which is obtained by an anisotropic etching technique, such as RIE (Reactive Ion Etching), has a shape which is far different from the shape of the light-shielding mask 23 as is shown in FIG. 6(C). More particularly, a useless region as shown in FIG. 6(C) as hatched is left at the lower portion of the step.

As a measure for overcoming the drawback involved in the known single layer resist process, there was known a so-called double layer resist process disclosed, for example, in "Process Techniques For Next Generation Super LSI," *Applications*, Apr. 4, 1988, by Realize Co., Ltd., (pp. 297–298). In this process, after the step of the substrate is filled in with a first resist layer, a second resist layer is formed on the first resist layer and is exposed to light and developed to obtain a mask. The first resist layer is subjected to patterning through the mask, thereby precisely controlling the patterned shape at the stepped portion.

FIGS. 7(A)–(F) illustrate the principle of the double layer resist process wherein there are shown steps of forming a film pattern on side walls 31a, 33a of two recesses 31, 33 of a semiconductor substrate 35, respectively. These figures are sectional views, respectively, of the semiconductor substrate 35 taken along the direction orthogonal to the side walls 31a, 33a.

Initially, a film 37 of material is formed on the entire surface of the semiconductor substrate 35 having the recesses 31, 33. A first thick resist layer 39 is then provided to define a flat upper surface (FIG. 7(A)).

Then, a second resist layer 41 is formed on the first resist layer 39 (FIG. 7(B)), after which the second resist layer 41 is subjected to exposure light in a desired pattern and developed to form resist patterns 41a, 41b (FIG. 7(C)).

Subsequently, the first resist layer 39 is subjected to patterning by, for example, dry etching to form the double layer resist patterns 43a, 43b (FIG. 7(D)).

The double layer resist patterns 43a, 43b are used as a mask for patterning the film material 37 so that portions 37a, 37b of the film material 37 are left over the respective side walls 31a, 33a defining the recesses 31, 33 (FIG. 7(E)).

Then, the double layer resist patterns 43a, 43b are removed to expose the desired film patterns 37a, 37b (FIG. 7(F)).

According to the double layer resist process, the flattening layer (first resist layer) and the layer exposed to light and subjected to development (second resist layer) are provided separately, so that a pattern shape corresponding to the shape of the exposure mask can be obtained even at the stepped portion.

However, the double layer resist process is complicated. As will be apparent from the process illustrated with reference to FIGS. 7(A)–(F), the double layer resist process has additional steps, including the step of applying the first resist layer and the step of patterning the first resist layer, compared with the single layer resist process. Moreover, although omitted in the above description, the double layer resist process inevitably requires a baking step after the application of the first resist layer and prior to the application of the second resist layer, wherein heat is applied to dry the first resist layer.

In addition, when the first resist layer is anisotropically etched, the second resist layer should have a satisfactory etching selection ratio to the first resist layer, thus presenting a problem in that the selection of materials is difficult.

The complicated process and the reduction in degree of freedom with respect to the selection of resist materials are not favorable, for example, in view of the fact that they contribute to a direct rise in the production costs of the semiconductor device.

Both the known single layer resist process and the known double layer resist process are disadvantageous in that the film pattern cannot be left only on the side wall or walls of the step (e.g. the ideal film pattern 17 should be left only on the side wall as shown in FIG. 5), i.e. the film pattern also remains on the upper and lower portions of the step. This is because in the prior processes, after the film material has been formed on the entire surface of the substrate including the step, a resist pattern is formed on the film material so as to cover the side wall. More particularly, in order to reliably cover the side wall with the resist pattern, a shift in the alignment between the mask used to form the resist pattern (the light-shielding mask as in FIG. 6(A)) and the side wall has to be taken into account. Accordingly, the light-shielding mask 23 must inevitably extend over the upper and lower portions of the step while covering the step. Since the material film 21 is formed on the entire surface of the substrate, the film pattern 21a will be left on the upper and lower portions of the step as corresponding to the additional regions required for the mask alignment. This phenomenon takes place in the double layer resist process illustrated with reference to FIG. 7.

SUMMARY OF THE INVENTION

The present invention has been accomplished in view of the situation stated above and has as its object the obviation of the above problems and the provision of a method wherein a desired pattern can be simply formed on a side wall or walls of a step.

According to the invention, after a film of material is formed over the entire surface of a base having a step therein, the film is initially removed by anisotropic etching except at a side wall or walls of the step. Accordingly, even if a mask layer is formed to extend over upper and lower portions of the step while taking into account an allowance for mask alignment, the film material will not be left at the upper and lower portions of the step because of the absence of the material on these upper and lower portions.

When the portion of the material left on the side wall is selectively removed by anisotropic etching from above the base surface (i.e. from a direction parallel to the side wall), the film material which has been provided only on the side wall of the step is patterned to dimensions regulated according to the dimensions of the mask layer on the upper portion of the step even though the resist pattern at the lower portion of the step is completely different from a desired one.

BRIEF DESCRIPTION OF THE DRAWINGS

1(A)–(G) illustrate a pattern formation method according to one embodiment of the invention.

BEST MODE FOR CARRYING OUT THE INVENTION

The pattern formation method of the invention will now be described with reference to the accompanying drawings. It will be noted that in the description of the following embodiments, a stepped base is described as a semiconductor substrate and thus, the invention is described as a method for fabricating a semiconductor device. In this connection, the invention can be widely applied to fields other than that of semiconductor devices in which it is intended to form a pattern on a side wall or walls of a step. It should also be noted that the figures illustrate the invention to an extent that the invention is understandable, and that the dimensions, shapes, positional relations and dimensional ratios of the respective members are not precise. Hence, the present invention should not be construed as being limited only to the embodiments shown in the figures.

Figure 1A:
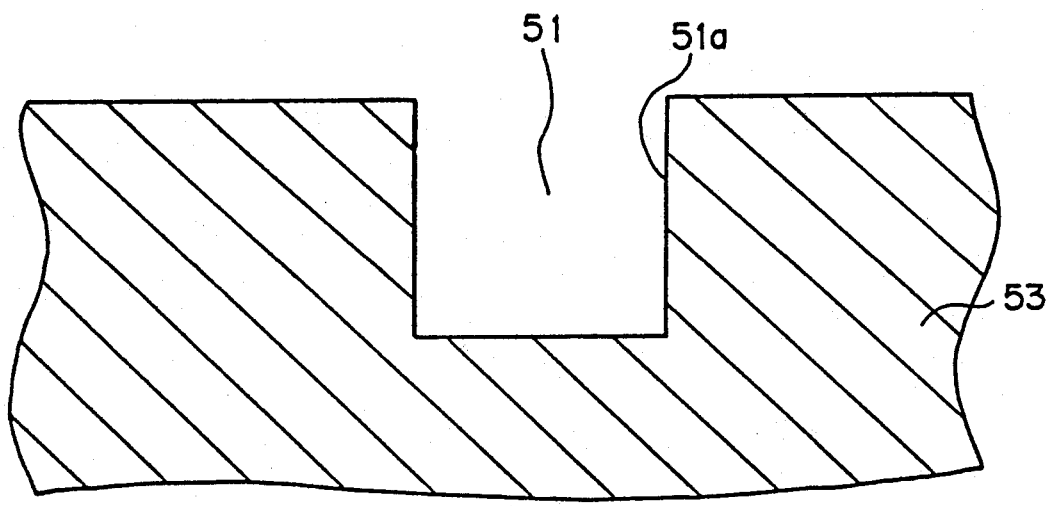
Figure 1B:
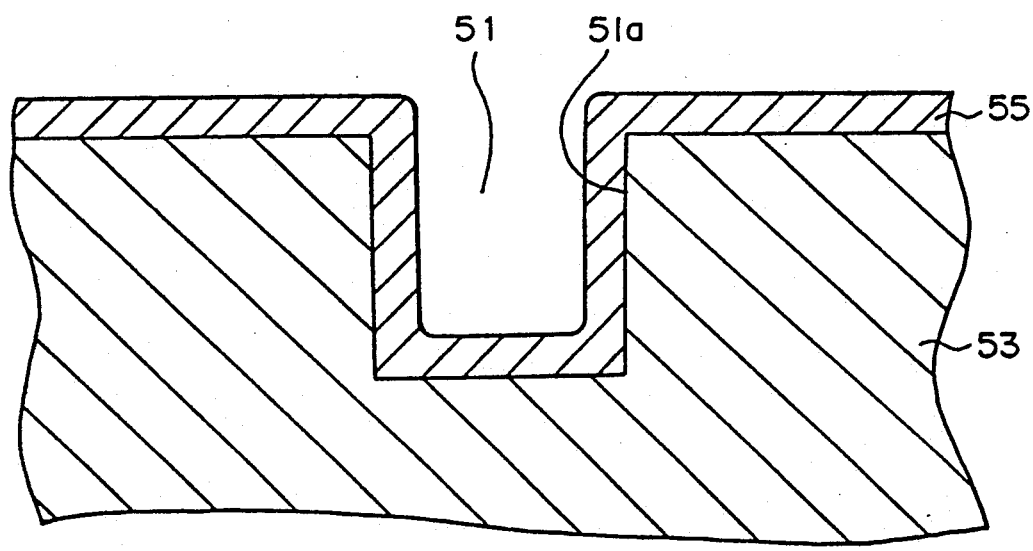
Figure 1C:
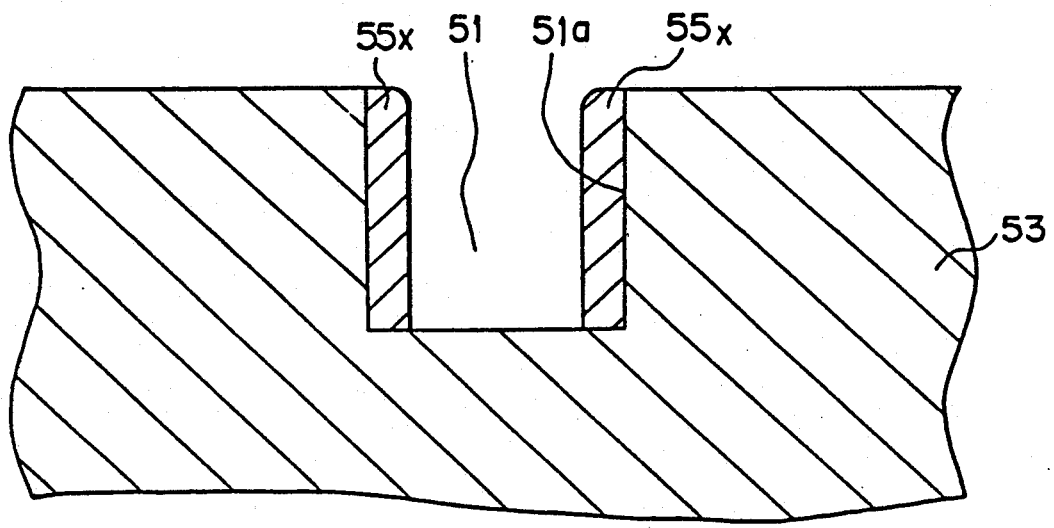
Figure 1D:
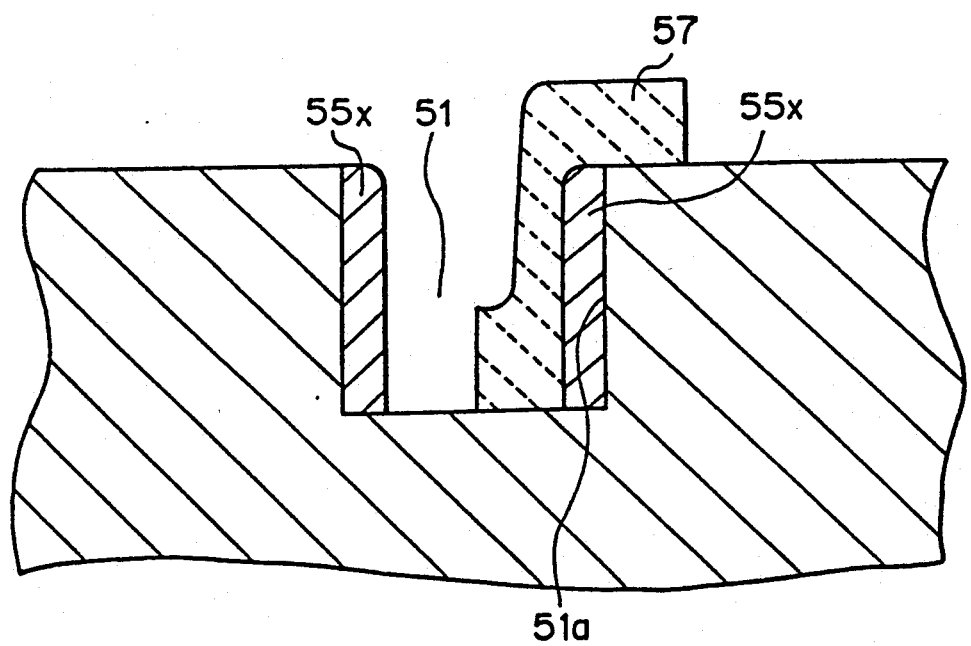
Figure 1E:
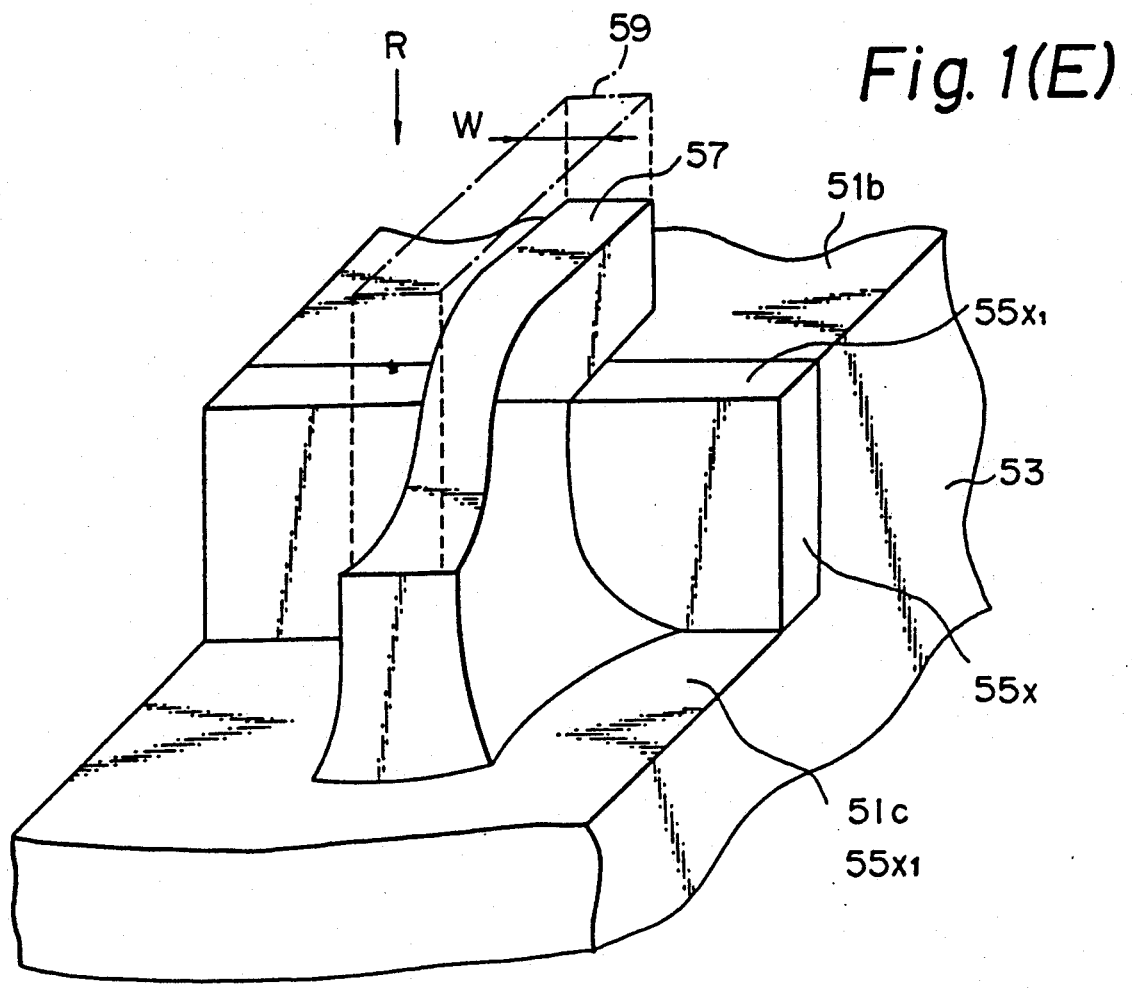
Figure 1F:
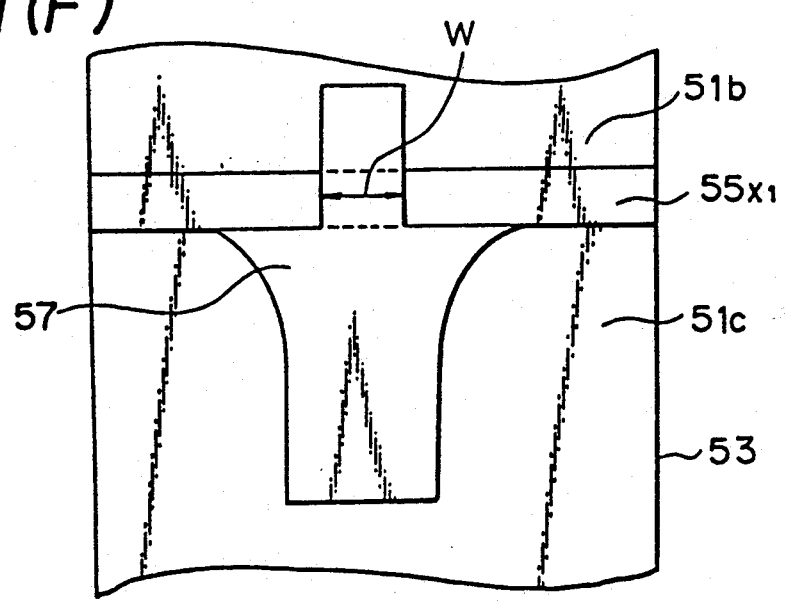
Figure 1:
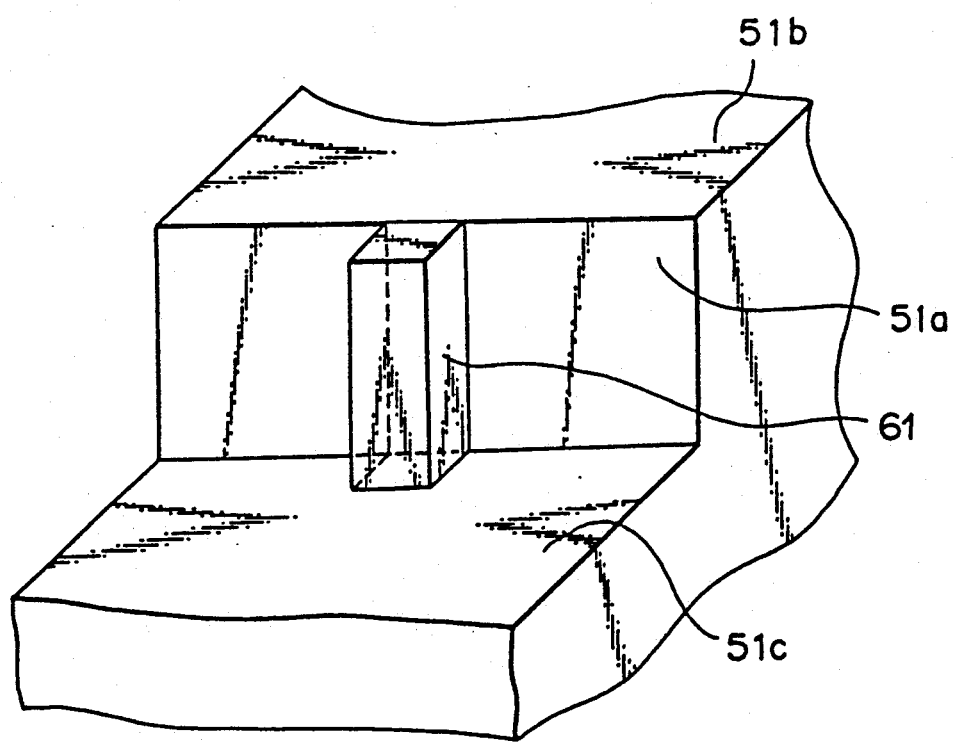

FIGS. 1(A)–(G) illustrate an embodiment of a pattern formation method according to the invention, wherein a semiconductor substrate 53 having a recess 51 is formed with a film pattern (not shown in FIG. 1(A)) on one side wall 51a defining the recess 51. FIGS. 1(A)–(D) are, respectively, sectional views of the semiconductor substrate 53 taken orthogonally to the side wall 51a; FIG. 1(E) is a perspective view of the side wall 51a taken in an oblique direction thereto; and FIG. 1(F) is a plan view of the semiconductor substrate 53. In this embodiment, the semiconductor substrate 53 can be a silicon substrate, for example, or other various semiconductor substrates such as gallium arsenic substrates and the like. The film pattern formed on the side wall 51a in this embodiment can be a wiring pattern or a gate electrode of a MOS transistor, for example. The materials for the film used to form the film pattern (not shown in FIG. 1(A)) include polysilicon, metals having a high melting point such as tungsten and the like, or silicides when the wiring or gate electrode is used as the film pattern. The depth of the recess 51 will depend on the structure and the degree of integration of a semiconductor device to be formed and is not critical, but is generally in the range of 1–5 μm. The steps of the pattern formation method will now be described in order.

Initially, a film 55 of material used to form a film pattern is formed over the entire surface of the semiconductor substrate 53 including the recess 51 (step). In this embodiment the film material 55 is deposited on the semiconductor substrate 53 according to an appropriate film formation technique which depends on the type of material (FIG. 1(B)).

Next, the film material 55 is removed by anisotropic etching except at the side walls (all of the side walls including the side wall 51a). This is carried out in this embodiment by etching the film material 55 from above the semiconductor substrate 53 according to the RIE method (FIG. 1(C)). In FIG. 1(C), reference numeral 55x indicates portions the film material 55 left on the side walls. These portions are hereinafter referred to as side wall film 55x.

Figure 6A:
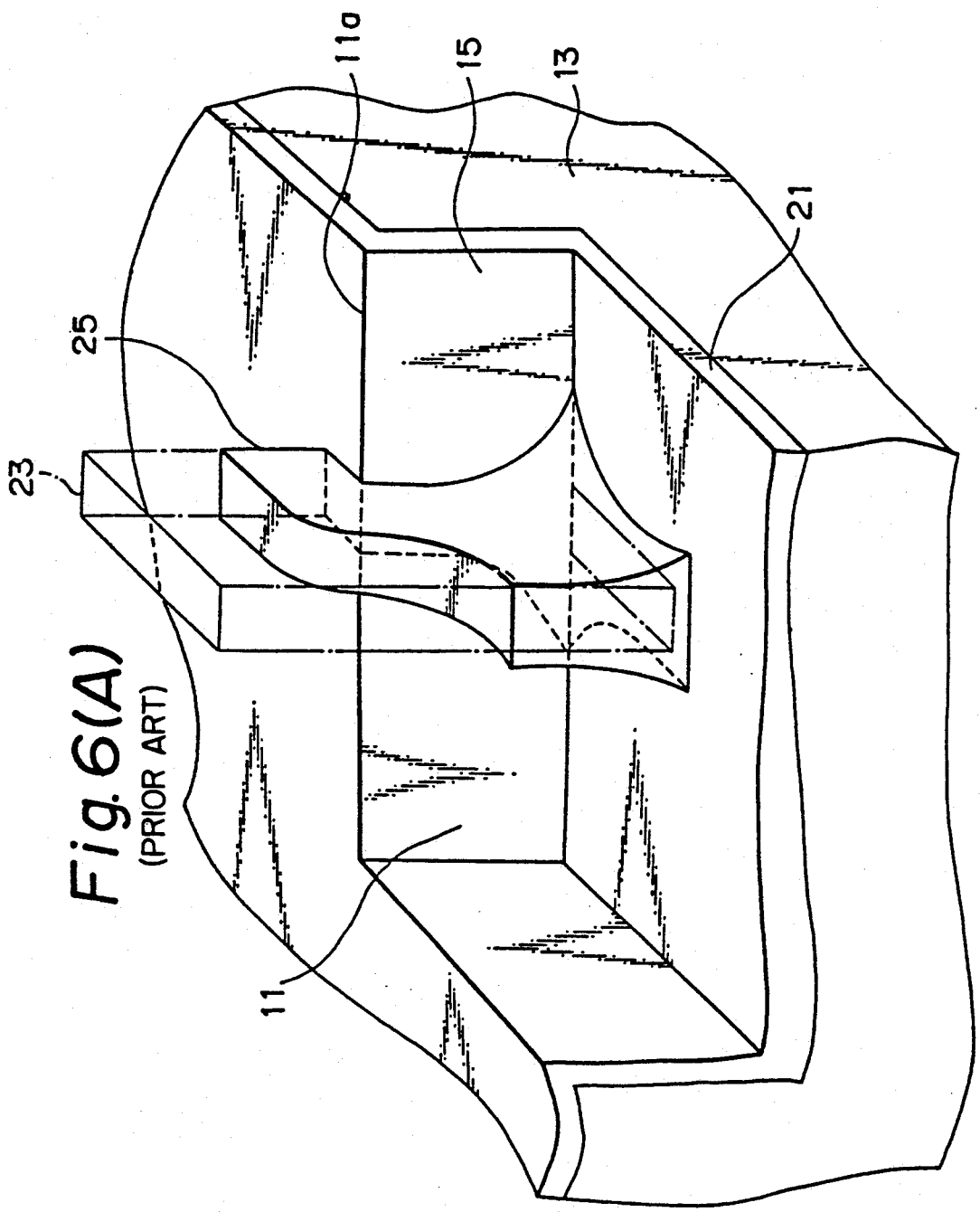
FIGS. 6(A)–(C) and FIGS. 7(A)–(F) respectively illustrate prior art processes.
Figure 6B:
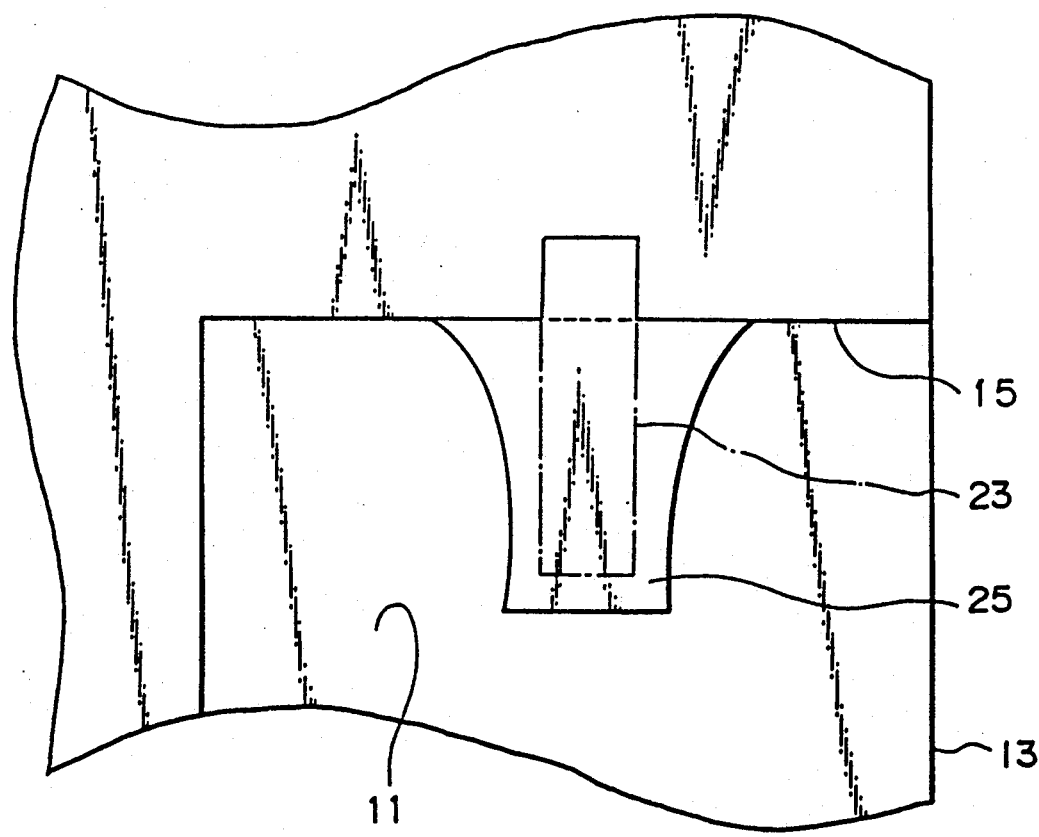
Figure 6C:
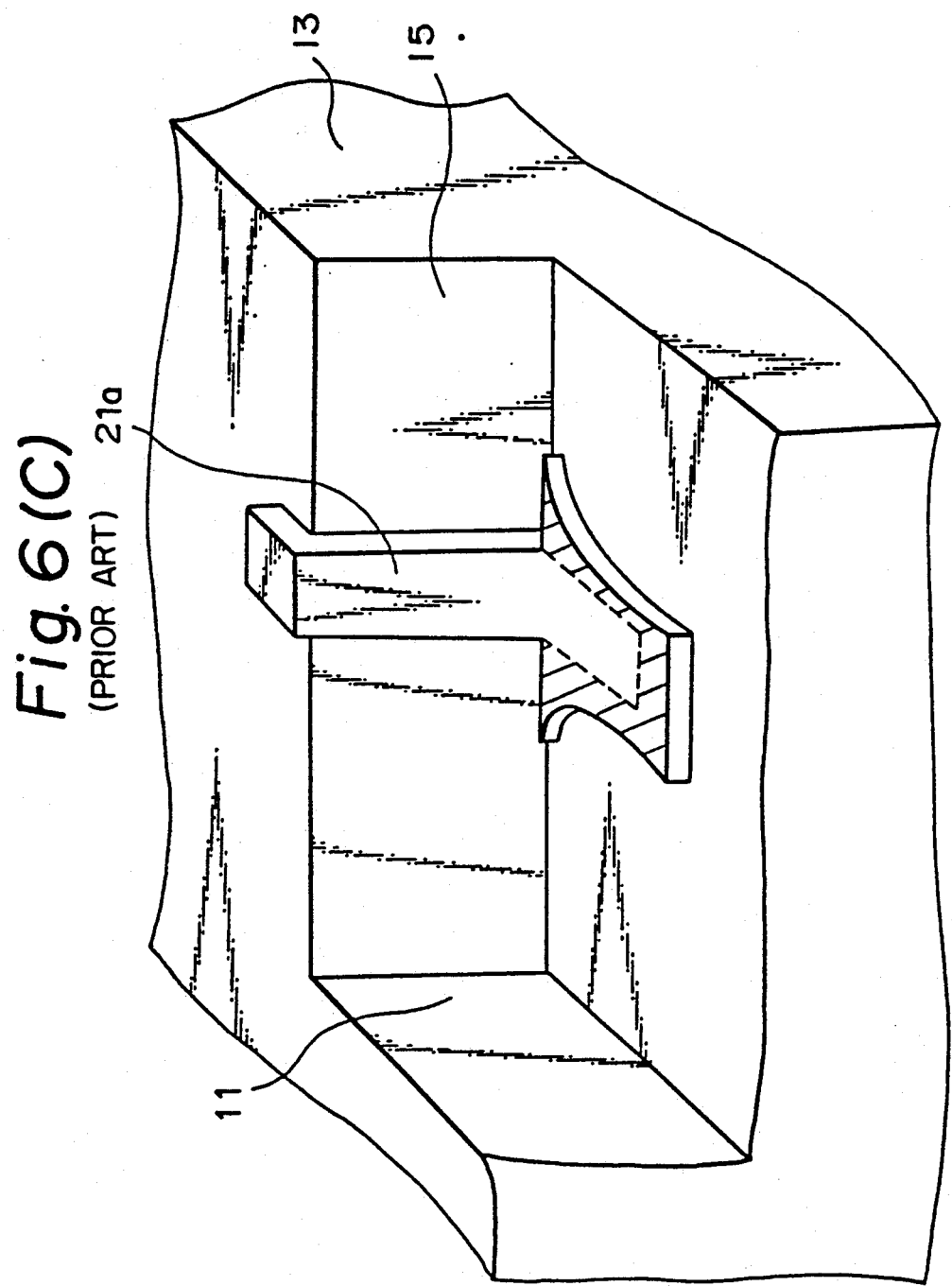
Figure 7A:
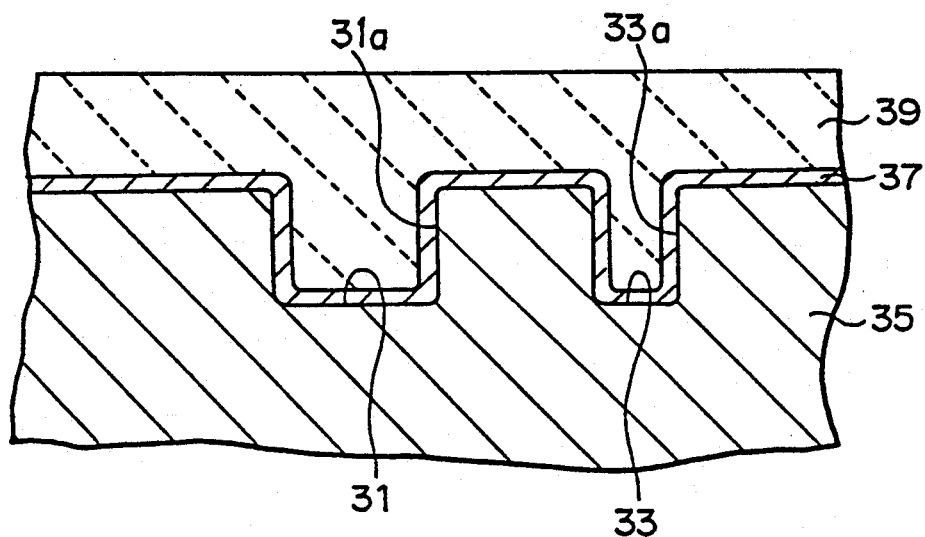
Figure 7B:
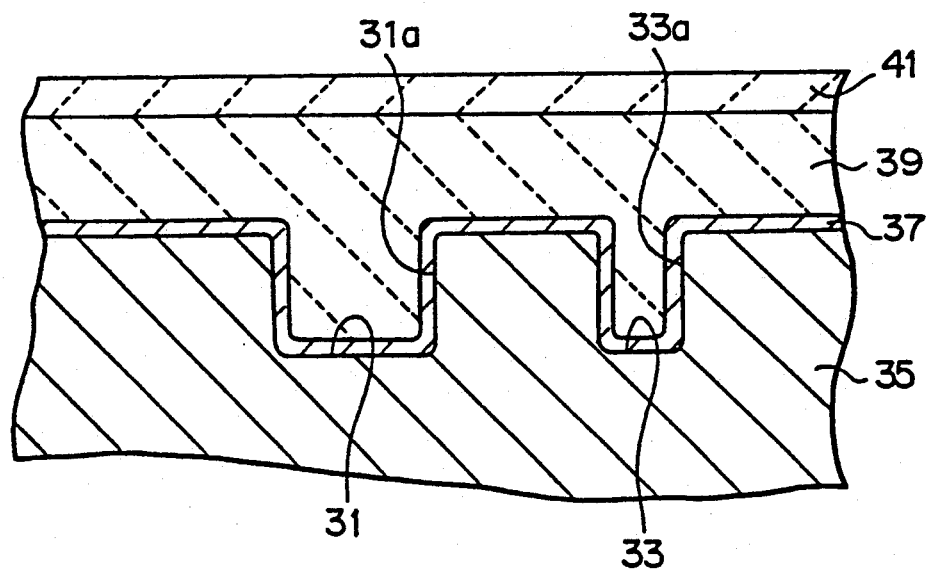
Figure 7C:
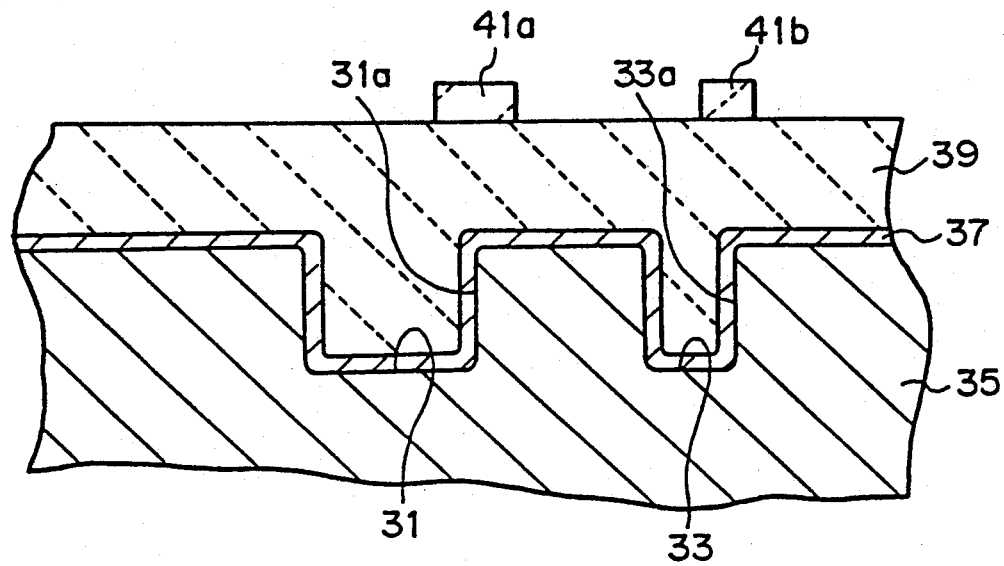
Figure 7D:
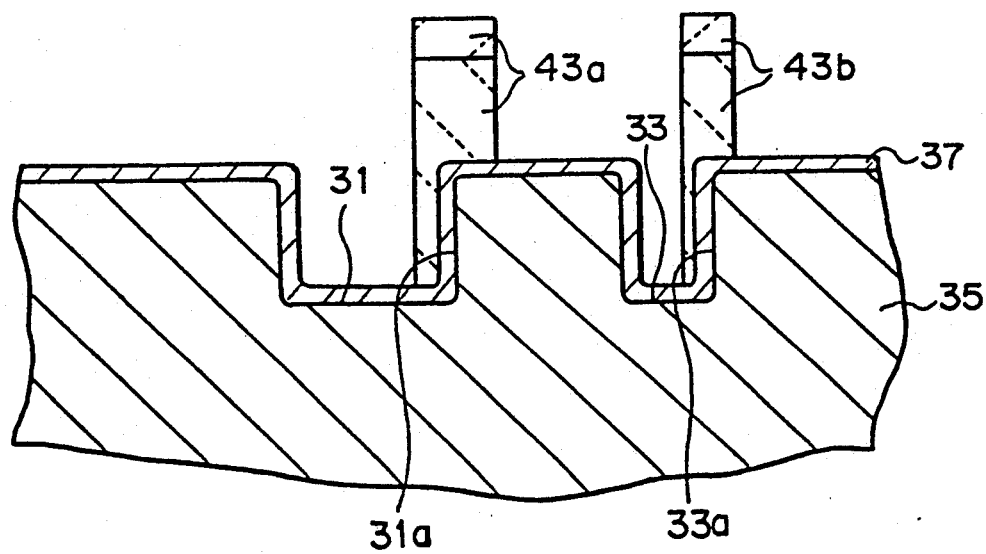
Figure 7E:
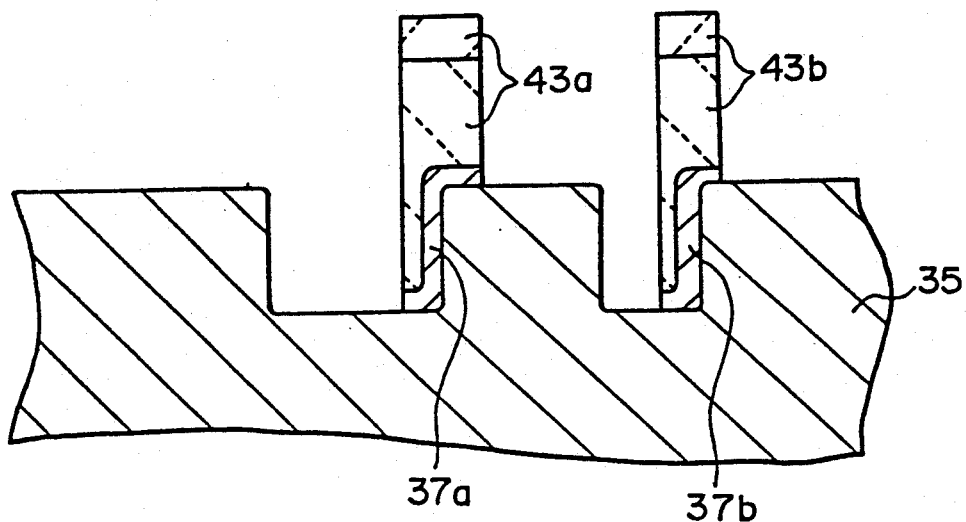
Figure 7F:
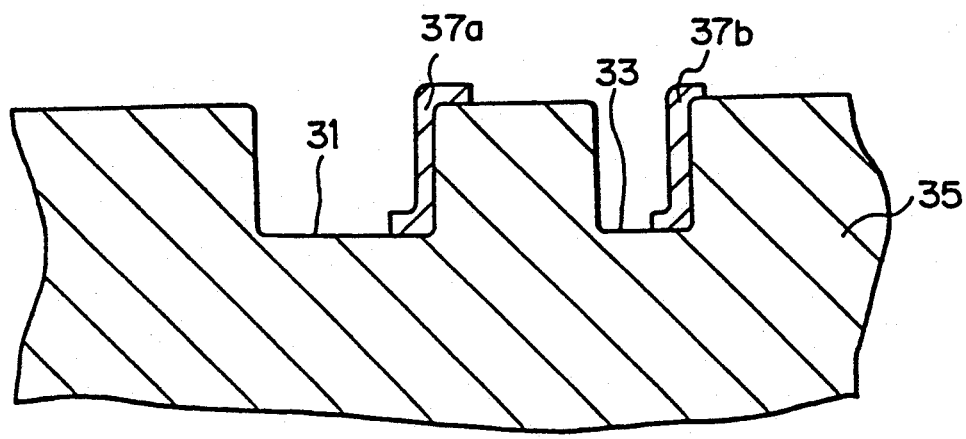

Thereafter, a mask layer is formed over the side film 55x extending from an upper portion to a lower portion of the step. This is performed in the following manner in this embodiment. First, a positive resist is applied over the entire surface of the semiconductor substrate 53 including the recess 51. The resist is exposed to light and developed so that it remains over the portion of the side wall 51a on which the side wall film 55x is formed, thereby forming a resist pattern 57 to be used as a mask layer (FIG. 1(D)). FIG. 1(E) is a perspective view showing the resist pattern 57 from a direction oblique to side wall 51a, and FIG. 1(F) is a plan view of the resist pattern 57 (from the direction R in FIG. 1(E)). From these figures, it will be apparent that the resist pattern 57 faithfully follows the shape of the upper portion 51b of the step and that of one end $55x_1$ on the side wall film 55 along the plane of the upper portion 51b of the step, but deviates from the shape of the mask pattern 59 in other portions thereof. It will be noted that the reason why the shape of the resist pattern 57 at the lower portion 51c of the step differs from the shape of the mask pattern 59 is similar to that explained with reference to FIGS. 6(B) and (C) and is therefore not described here.

Subsequently, the side wall film 55x is selectively removed through the mask of the resist pattern 57. In this embodiment, the selective removal of the side wall film 55x is performed by anisotropic etching similar to that used to remove the portions other than the side wall film 55x of the material film. In this anisotropic etching step, the side wall film 55x is removed from one end $55x_1$ of the side wall film toward the lower portion 51c of the step, so that the side wall film 55x remains only at a portion corresponding to a portion of the resist pattern 57 having a width W. As a consequence, there is obtained a film pattern 61 shown in FIG. 1(G).

The thus obtained film pattern 61 can be effectively utilized, for example, as a wiring pattern or a gate electrode for a MOS transistor.

Figure 2A:
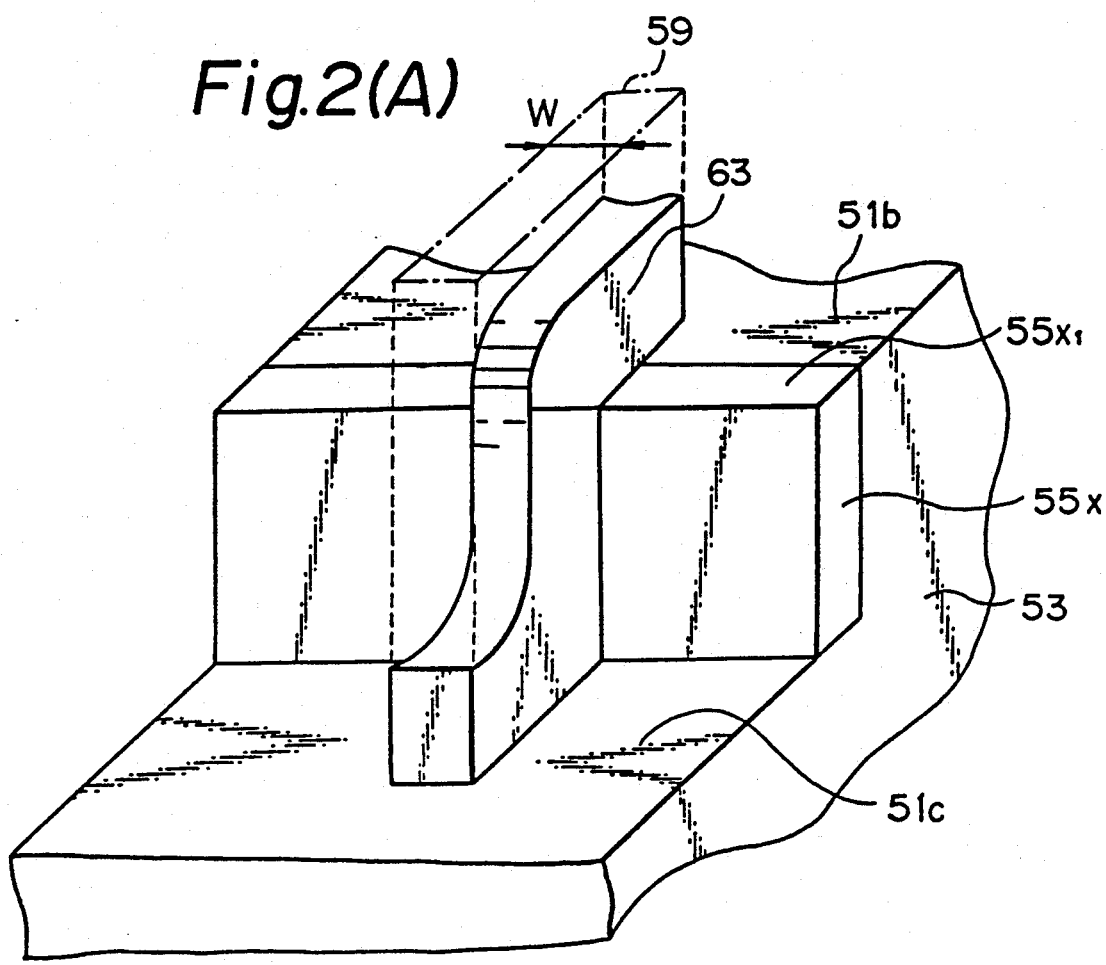
FIGS. 2(A) and (B) illustrate another embodiment of a pattern formation method of the invention.
Figure 2B:
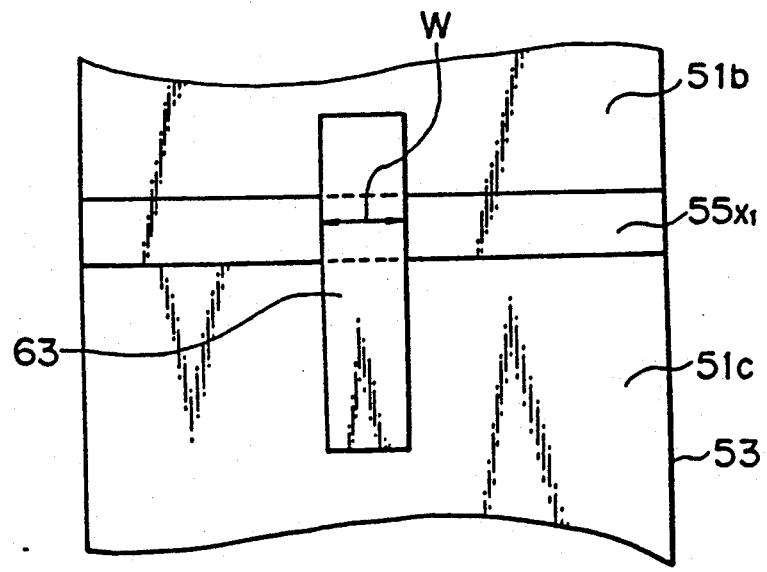

When the mask layer, extending from the upper portion 51b of the step to the lower portion 51c, is a resist pattern 63 which follows the shape of the mask pattern 59 at the lower portion 51c of the step as will be described with reference to FIGS. 2(A) and (B), the side wall film 55x may be selectively removed by a technique other than anisotropic etching, such as, for example, by wet etching.

In the above embodiment, the side wall defining the recess 51 of the semiconductor substrate 53, i.e. the side wall of the step, is illustrated as extending vertically to the plane of the upper portion of the step (i.e. the main plane of the substrate). However, even though the recess may be tapered or vice versa, the present invention is likewise applicable provided that the angle between the main plane of the substrate and the side wall is within a range which permits anisotropic etching.

In order to facilitate a better understanding of the pattern formation method according to the invention, the use of the film pattern according to the method will now be described in more detail.

APPLICATION EXAMPLE 1

Figure 3A:
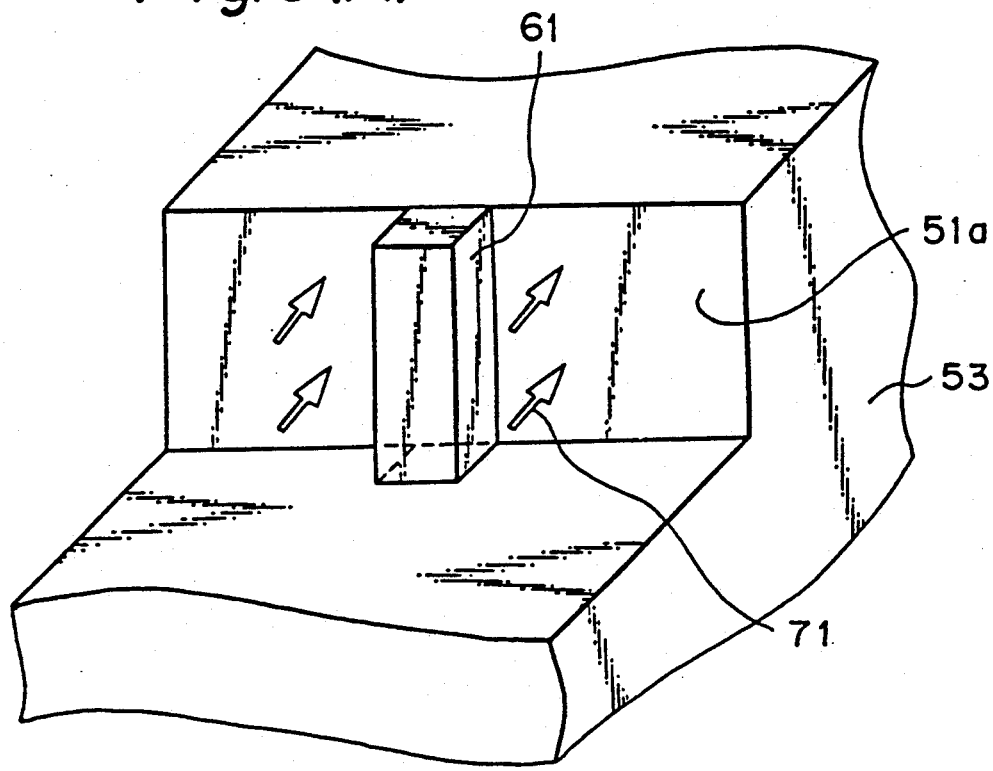
FIGS. 3(A) and (B) are, respectively, perspective views illustrating one application of a pattern formation method of the invention.
Figure 3B:
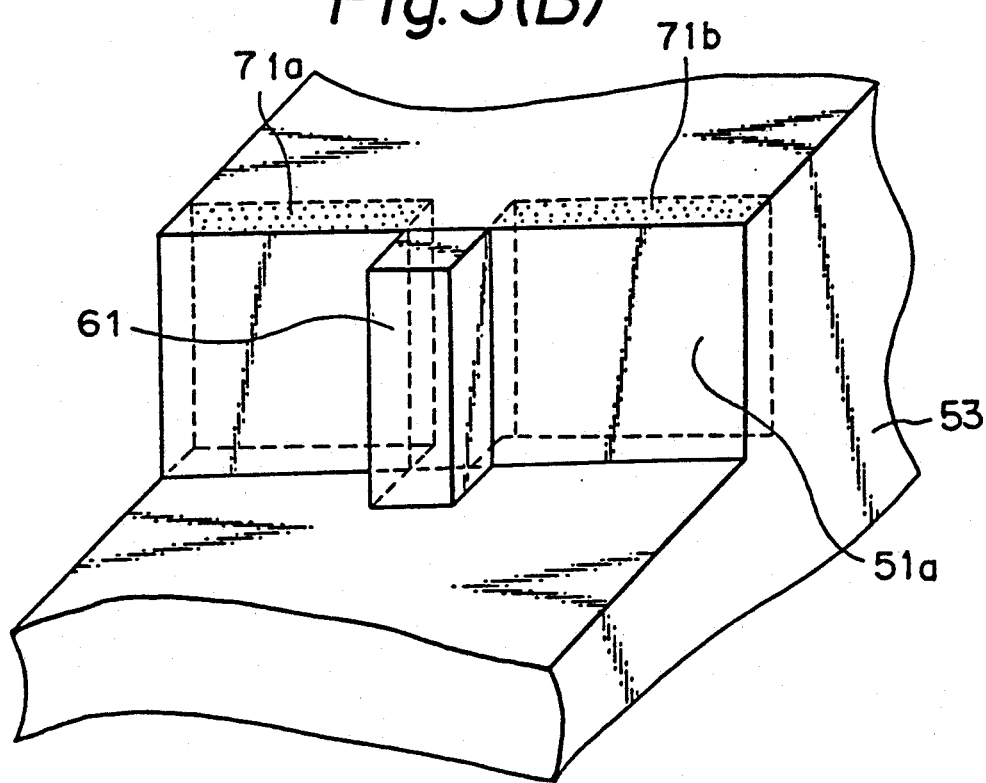

FIGS. 3(A) and (B) show an example wherein a film pattern 61 formed by the method illustrated with reference to FIGS. 1(A) to 1(G) was used as a mask and ions (71 indicated by the arrows in FIG. 3(A)) were incorporated in the side wall 51a of the step by, for example, ion injection of ion diffusion, thereby forming reactive layers 71a, 71b which were, for example, source drain regions of a MOS transistor. In this manner, the MOS transistor can be readily formed at the side walls.

APPLICATION EXAMPLE 2

Figure 4:
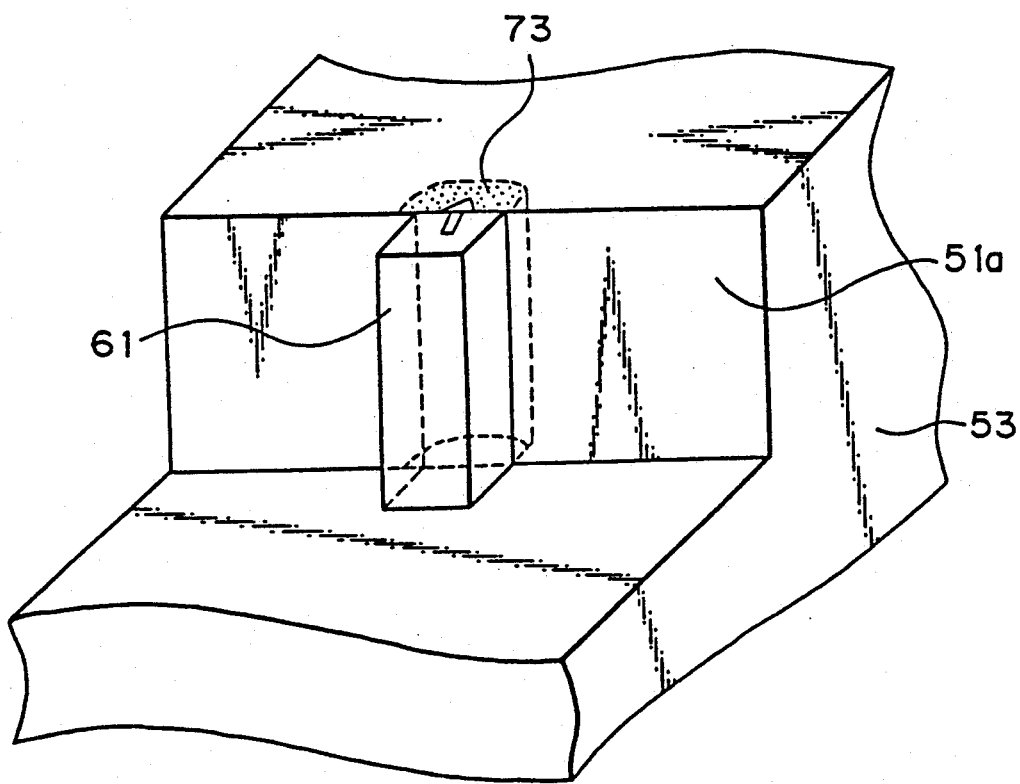
FIG. 4 is a perspective view illustrating another application of a pattern formation method of the invention.
Figure 5:
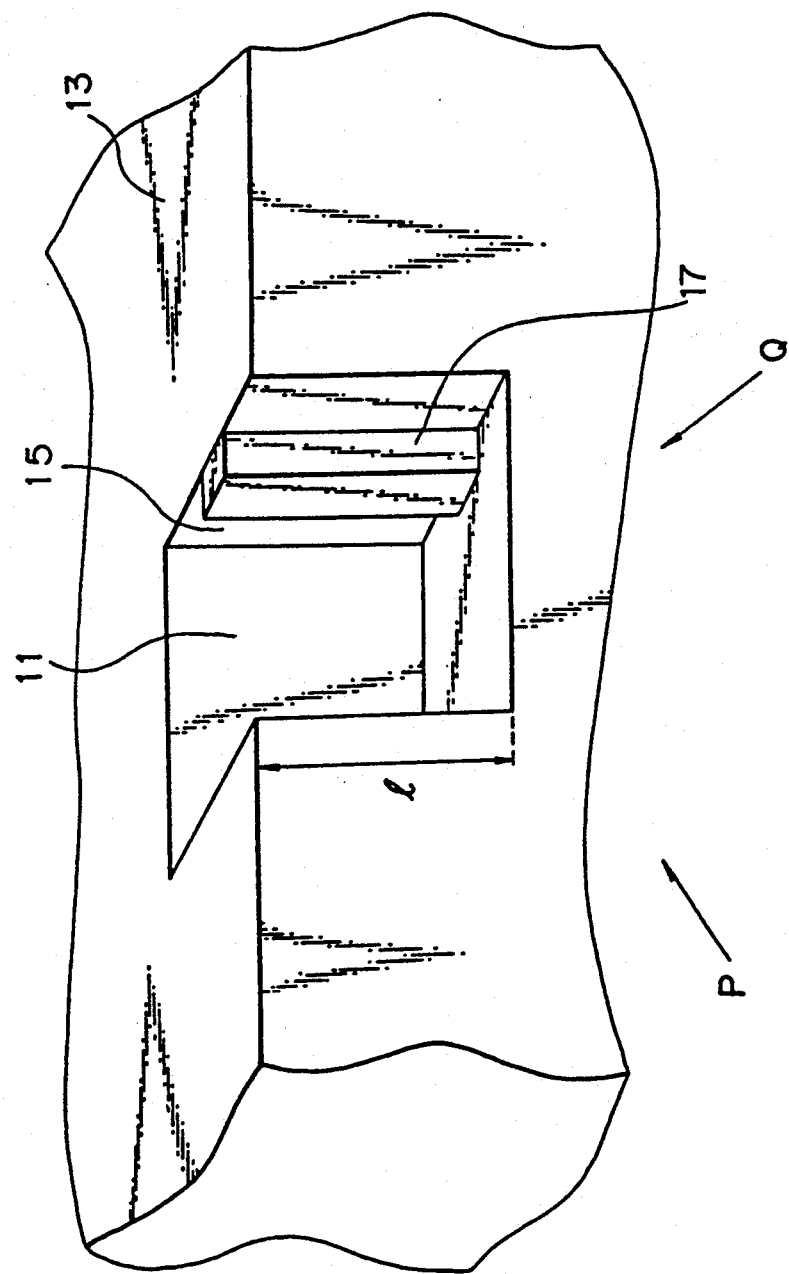
FIG. 5 is a perspective view of an ideal film pattern.

FIG. 4 shows an example wherein an impurity was diffused, from the film pattern 61 formed by the method illustrated with reference to FIGS. 1(A)-1(G), toward the side wall 51a to form a reactive layer 73. Alternatively, the material of the film pattern 61 and the semiconductor substrate can be reacted at the contact portion thereof to form a reactive layer 73. In this manner, there can be readily formed a silicide layer, for example, in the side wall 51a.

As will be apparent from the foregoing description, the pattern formation method according to the invention can mitigate the precision necessary for mask alignment since there is no film material at the upper and lower portions of a step over the entire surface of base.

Since the mask layer has a shape which is completely different from a desired shape at the lower portion of the step, a desired film pattern can be obtained, permitting a known simple resist process to be used for this purpose.

Accordingly, a desired pattern can be simply formed on the side walls of the step.

We claim:
1. A pattern formation method for forming a film pattern on a side wall of a step in a base, said method comprising:
   the step of forming a film of a material, used to form said film pattern, over the entire surface of the base including the surface of said step;
   the step of removing the film by anisotropically etching all portions thereof other than those at the side wall of said step;
   the step of forming a mask layer over the portions of said film remaining on said side wall such that the mask extends from an upper portion to a lower portion of said step; and
   the step of selectively removing portions of said film remaining on said side wall while using the mask layer as a mask, whereby a film pattern remains on the side wall.
2. A pattern formation method according to claim 1, wherein the selective removal of the remaining portions of said material film on said side wall is performed by anisotropic etching from above the base.

* * * * *